(12) United States Patent
Willingham

(10) Patent No.: US 11,323,123 B2
(45) Date of Patent: May 3, 2022

(54) CIRCUIT TO CORRECT PHASE INTERPOLATOR ROLLOVER INTEGRAL NON-LINEARITY ERRORS

(71) Applicant: Microchip Technology Inc., Chandler, AZ (US)

(72) Inventor: Mike Willingham, Frisco, TX (US)

(73) Assignee: Microchip Technology Inc., Chandler, AZ (US)

( * ) Notice: Subject to any disclaimer, the term of this patent is extended or adjusted under 35 U.S.C. 154(b) by 88 days.

(21) Appl. No.: 16/827,691

(22) Filed: Mar. 23, 2020

(65) Prior Publication Data

US 2021/0194488 A1 Jun. 24, 2021

Related U.S. Application Data

(60) Provisional application No. 62/952,201, filed on Dec. 20, 2019.

(51) Int. Cl.
| | |
|---|---|
| *H03L 7/099* | (2006.01) |
| *H03L 7/081* | (2006.01) |
| *H03L 7/10* | (2006.01) |
| *H03L 7/197* | (2006.01) |

(52) U.S. Cl.
CPC ............. *H03L 7/081* (2013.01); *H03L 7/099* (2013.01); *H03L 7/104* (2013.01); *H03L 7/1976* (2013.01)

(58) Field of Classification Search
CPC ....... H03L 7/081; H03L 7/099; H03L 7/1974; H03L 7/1976
See application file for complete search history.

(56) References Cited

U.S. PATENT DOCUMENTS

| | | |
|---|---|---|
| 5,343,482 A | 8/1994 | Penner et al. |
| 5,371,765 A | 12/1994 | Guilford |
| 5,600,824 A | 2/1997 | Williams et al. |
| 5,640,398 A | 6/1997 | Carr et al. |
| 5,838,512 A | 11/1998 | Okazaki |
| 5,850,422 A | 12/1998 | Chen |
| 5,905,766 A | 5/1999 | Nguyen |
| 6,044,122 A | 3/2000 | Ellersick et al. |
| 6,052,073 A | 4/2000 | Carr et al. |
| 6,138,061 A | 10/2000 | McEnnan et al. |
| 6,150,965 A | 11/2000 | Carr et al. |
| 6,188,699 B1 | 2/2001 | Lang et al. |
| 6,333,935 B1 | 12/2001 | Carr et al. |
| 6,345,052 B1 | 2/2002 | Tse et al. |

(Continued)

FOREIGN PATENT DOCUMENTS

WO 2003039061 A2 5/2003

OTHER PUBLICATIONS

U.S. Appl. No. 62/953,301, filed Dec. 24, 2019, Peter Meyer.

(Continued)

*Primary Examiner* — Patrick O Neill
(74) *Attorney, Agent, or Firm* — Glass and Associates; Kenneth Glass; Kenneth D'Alessandro

(57) ABSTRACT

A circuit for correcting phase interpolator rollover integral non-linearity errors includes a rollover detector circuit for detecting when a rollover event of a phase interpolator has occurred, and a correction circuit that adds a signed predistortion correction to a VCO clock cycle phase fraction value when the rollover detector circuit has detected the interpolator rollover event.

17 Claims, 6 Drawing Sheets

(56) References Cited

U.S. PATENT DOCUMENTS

| | | |
|---|---|---|
| 6,359,479 B1 | 3/2002 | Oprescu |
| 6,584,521 B1 | 6/2003 | Dillabough et al. |
| 6,603,776 B1 | 8/2003 | Fedders et al. |
| 6,668,297 B1 | 12/2003 | Karr et al. |
| 6,671,758 B1 | 12/2003 | Cam et al. |
| 6,744,787 B1 | 6/2004 | Schatz et al. |
| 6,820,159 B2 | 11/2004 | Mok et al. |
| 6,823,001 B1 | 11/2004 | Chea |
| 6,870,831 B2 | 3/2005 | Hughes et al. |
| 7,117,112 B2 | 10/2006 | Mok |
| 7,161,999 B2 | 1/2007 | Parikh |
| 7,165,003 B2 | 1/2007 | Mok |
| 7,187,741 B2 | 3/2007 | Pontius et al. |
| 7,203,616 B2 | 4/2007 | Mok |
| 7,239,650 B2 | 7/2007 | Rakib et al. |
| 7,239,669 B2 | 7/2007 | Cummings et al. |
| 7,295,945 B2 | 11/2007 | Mok |
| 7,388,160 B2 | 6/2008 | Mok et al. |
| 7,417,985 B1 | 8/2008 | McCrosky et al. |
| 7,468,974 B1 | 12/2008 | Carr et al. |
| 7,492,760 B1 | 2/2009 | Plante et al. |
| 7,593,411 B2 | 9/2009 | McCrosky et al. |
| 7,656,791 B1 | 2/2010 | Mok et al. |
| 7,668,210 B1 | 2/2010 | Mok et al. |
| 7,751,411 B2 | 7/2010 | Cam et al. |
| 7,772,898 B2 | 8/2010 | Cheung |
| 7,807,933 B2 | 10/2010 | Mok et al. |
| 8,085,764 B1 | 12/2011 | McCrosky et al. |
| 8,413,006 B1 | 4/2013 | Mok et al. |
| 8,428,203 B1 | 4/2013 | Zortea et al. |
| 8,542,708 B1 | 9/2013 | Mok et al. |
| 8,854,963 B1 | 10/2014 | Muma et al. |
| 8,913,688 B1 | 12/2014 | Jenkins |
| 8,976,816 B1 | 3/2015 | Mok et al. |
| 8,989,222 B1 | 3/2015 | Mok et al. |
| 9,019,997 B1 | 4/2015 | Mok et al. |
| 9,025,594 B1 | 5/2015 | Mok et al. |
| 9,276,874 B1 | 3/2016 | Mok et al. |
| 9,313,563 B1 | 4/2016 | Mok et al. |
| 9,374,265 B1 | 6/2016 | Mok et al. |
| 9,473,261 B1 | 10/2016 | Tse et al. |
| 9,503,254 B2 | 11/2016 | Rahbar et al. |
| 9,525,482 B1 | 12/2016 | Tse |
| 10,069,503 B2 | 9/2018 | Zhang et al. |
| 10,104,047 B2 | 10/2018 | Muma et al. |
| 10,128,826 B2 | 11/2018 | Jin et al. |
| 10,250,379 B2 | 4/2019 | Haddad et al. |
| 10,432,553 B2 | 10/2019 | Tse |
| 10,594,329 B1 * | 3/2020 | Elkholy ............... H03M 3/344 |
| 10,608,647 B1 | 3/2020 | Ranganathan et al. |
| 10,715,307 B1 | 7/2020 | Jin |
| 2001/0056512 A1 | 12/2001 | Mok et al. |
| 2005/0110524 A1 | 5/2005 | Glasser |
| 2006/0056560 A1 | 3/2006 | Aweya et al. |
| 2006/0076988 A1 | 4/2006 | Kessels et al. |
| 2007/0036173 A1 | 2/2007 | McCrosky et al. |
| 2007/0064834 A1 | 3/2007 | Yoshizawa |
| 2007/0132259 A1 | 6/2007 | Ivannikov et al. |
| 2008/0000176 A1 | 1/2008 | Mandelzys et al. |
| 2008/0202805 A1 | 8/2008 | Mok et al. |
| 2010/0052797 A1 | 3/2010 | Carley et al. |
| 2011/0095830 A1 | 4/2011 | Tsangaropoulos et al. |
| 2014/0055179 A1 | 2/2014 | Gong et al. |
| 2014/0139275 A1 | 5/2014 | Dally et al. |
| 2016/0277030 A1 | 9/2016 | Burbano et al. |
| 2016/0301669 A1 | 10/2016 | Muma et al. |
| 2017/0244648 A1 | 8/2017 | Tse |
| 2018/0131378 A1 | 5/2018 | Haroun et al. |
| 2018/0159541 A1 | 6/2018 | Spijker |

OTHER PUBLICATIONS

U.S. Appl. No. 16/563,399, filed Sep. 6, 2019, Qu Gary Jin.
U.S. Appl. No. 16/795,520, filed Feb. 19, 2020, Peter Meyer.
Abdo Ahmad et al: "Low-Power Circuit for Measuring and Compensating Phase Interpolator Non-Linearity", 2019 IEEE 10th Annual Information Technology, Electronics and Mobile Communication Conference (IEMCON), IEEE, Oct. 17, 2019 (Oct. 17, 2019), pp. 310-313.
PCT/US2020/038947, International Search Report and written opinion, European Patent Office, dated Sep. 24, 2020.

* cited by examiner

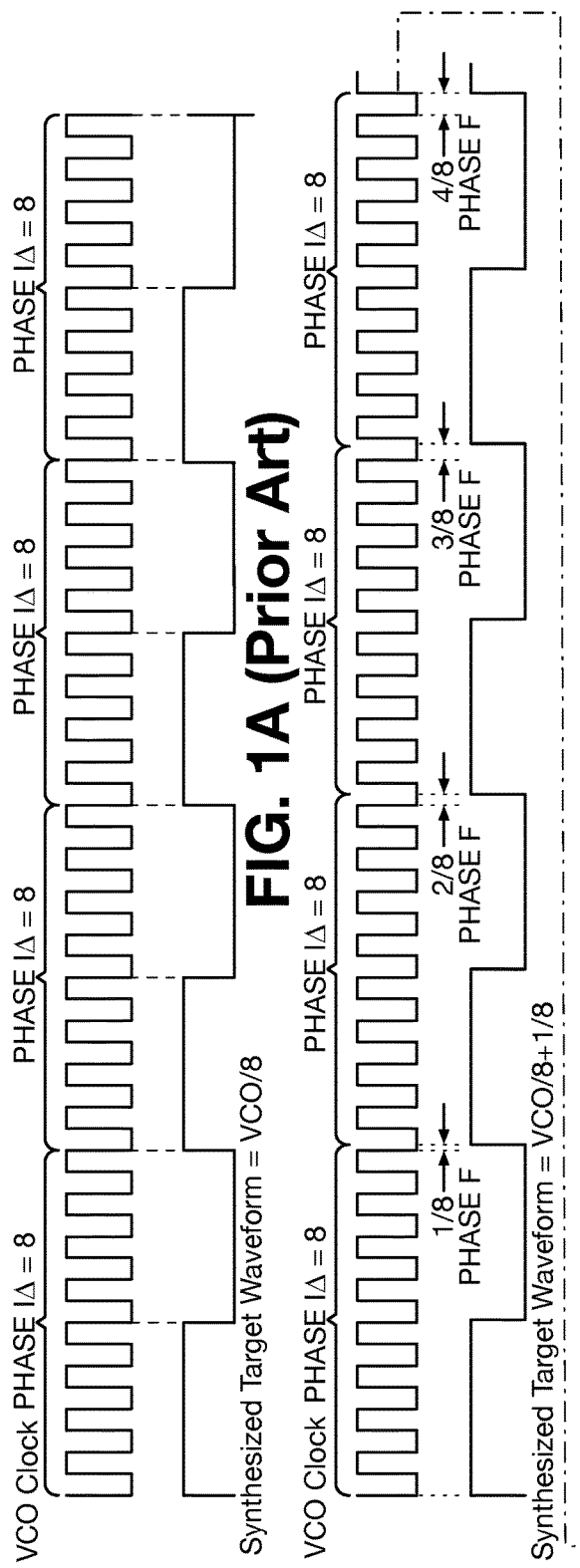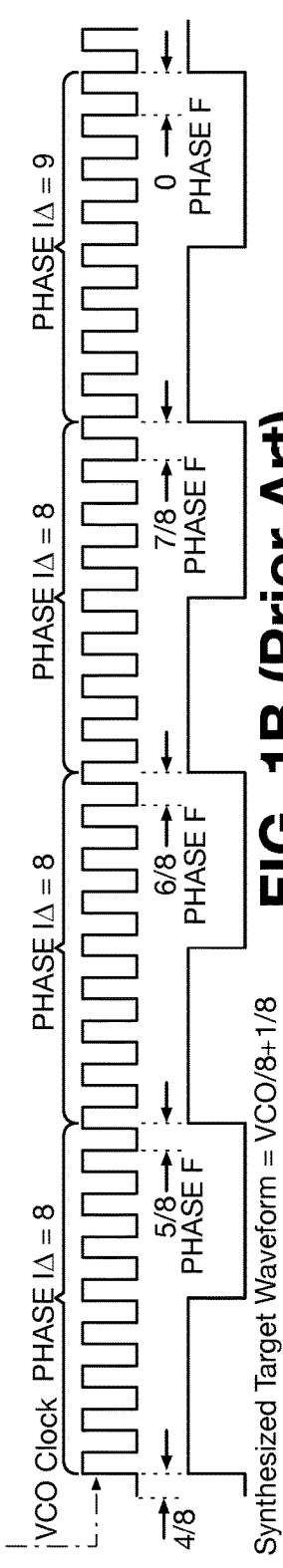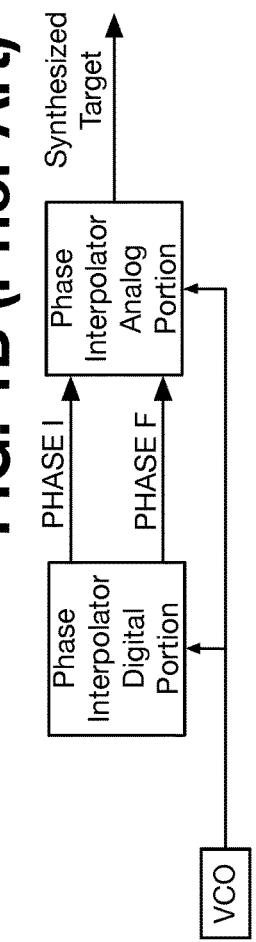

Divide VCO by 8+1/8

| Cumulative Phase Integer (PHASE I) | 8 | 16 | 24 | 32 | 40 | 48 | 56 | 65 | 8 |
|---|---|---|---|---|---|---|---|---|---|
| Phase Integer Delta (PHASE IΔ) | 8 | 8 | 8 | 8 | 8 | 8 | 8 | 9 | 8 |
| VCO Clock Cycle Phase Fraction (PHASE F) | 1/8 | 2/8 | 3/8 | 4/8 | 5/8 | 6/8 | 7/8 | 0 | 1/8 |
| VCO Clock Cycle Phase* | 128 | 256 | 384 | 512 | 640 | 768 | 896 | 1024** | 128 |

*at VCO clock cycle quantized into 1,024 phase increments per VCO clock cycle     **1,024 = 0

Divide VCO by 8+3/8

| Cumulative Phase Integer (PHASE I) | 8 | 16 | 25 | 33 | 41 | 50 | 58 | 67 | 8 |
|---|---|---|---|---|---|---|---|---|---|
| Phase Integer Delta (PHASE IΔ) | 8 | 8 | 9 | 8 | 8 | 9 | 8 | 9 | 8 |
| VCO Clock Cycle Phase Fraction (PHASE F) | 3/8 | 6/8 | 1/8 | 4/8 | 7/8 | 2/8 | 5/8 | 0 | 3/8 |
| VCO Clock Cycle Phase* | 384 | 768 | 128 | 512 | 896 | 256 | 640 | 1024** | 384 |

*at VCO clock cycle quantized into 1,024 phase increments per VCO clock cycle     **1,024 = 0

Divide VCO by 9+7/8

| Cumulative Phase Integer (PHASE I) | 9 | 18 | 27 | 36 | 45 | 54 | 63 | 71 | 9 |
|---|---|---|---|---|---|---|---|---|---|
| Phase Integer Delta (PHASE IΔ) | 9 | 9 | 9 | 9 | 9 | 9 | 9 | 8 | 9 |
| VCO Clock Cycle Phase Fraction (PHASE F) | 7/8 | 6/8 | 5/8 | 4/8 | 3/8 | 2/8 | 1/8 | 0 | 7/8 |
| VCO Clock Cycle Phase* | 896 | 768 | 640 | 512 | 384 | 256 | 128 | 1024** | 896 |

*at VCO clock cycle quantized into 1,024 phase increments per VCO clock cycle     **1,024 = 0

FIG. 2 (Prior Art)

CIRCUIT TO CORRECT PHASE INTERPOLATOR ROLLOVER INTEGRAL NON-LINEARITY ERRORS

REFERENCE TO RELATED APPLICATIONS

The present application claims priority to United States Provisional Patent Application Ser. No. 62/952,201, filed on Dec. 20, 2019, the contents of which are incorporated by reference herein in their entirety.

BACKGROUND

The present invention relates to phase interpolation. More particularly, the present invention relates to circuits to correct phase interpolator seam non-linearity errors.

Some circuit designs employ frequency synthesizers which synthesize any desired target frequency from a high frequency voltage controlled oscillator (VCO) clock. The VCO clock can be quantized into a fixed number of phase increments per cycle. As is well known in the art, some frequency synthesizers synthesize a target frequency by dividing the VCO clock output by a divisor that has an integer portion and may also include a fractional portion. One known way of accomplishing this frequency division is to provide a circuit with an accumulator that accumulates at every VCO clock cycle a frequency control word (FCW) equal to a number of accumulated phase increments of the VCO clock cycle that is selected based on the desired target frequency until the output value of the accumulator exceeds a predefined number (overflows) that is also selected based on the desired target frequency. The amount by which the output value of the accumulator exceeds the predefined number at overflow defines the fractional portion of the divisor. At the VCO clock cycle where the accumulated output value of the accumulator exceeds the predefined number, a CARRY signal is generated, and is delayed by the fractional portion of the divisor in the accumulator to define a clock edge of the synthesized target frequency. This signal output is shown as the rising edge of the synthesized target waveform in FIGS. 1A and 1B. This process of employing a divisor having a fractional portion is sometimes referred to as phase interpolation.

Where the VCO clock is divided by a whole number (an integer with no fractions), in each cycle of the synthesized target waveform the accumulated phase increments of the VCO clock (referred to herein as the cumulative phase integer (PHASE I) value) will increase by a constant phase integer delta (PHASE IΔ) value equal to the number of phase increments in each VCO clock cycle included in a single target output clock cycle. The increase will not include any VCO clock cycle phase fraction (PHASE F) value. This is illustrated in FIG. 1A showing a VCO clock waveform (top) and a synthesized target output waveform (bottom) where the VCO frequency has been divided by a whole number 8 to produce the synthesized target output waveform. As can be seen there is no phase fractional component PHASE F, i.e. the VCO clock cycle phase fraction (PHASE F) value is zero.

Where the VCO clock is divided by a number with a fractional component, the value of the phase integer delta (PHASE IΔ) will modulate between a maximum and a minimum value. This is illustrated in FIG. 1B showing a VCO clock waveform (top) and a synthesized target output waveform (bottom) where the VCO frequency has been divided by 8+⅛. The value of the phase integer delta PHASE IΔ is 8 during the first seven cycles of the synthesizer output waveform and is 9 during the eighth cycle. The value of the phase integer delta PHASE IΔ returns to 8 in the next cycle of the synthesized target clock waveform.

As can also be seen from an examination of FIG. 1B, a VCO clock cycle phase fraction value (PHASE F) will be included in each complete cycle of the synthesized target waveform, as indicated by the pair of vertical dimension lines showing the VCO clock cycle phase fraction PHASE F value that exists at the rising edge of each cycle of the synthesized target output waveform. The rising edge of each cycle of the synthesized target waveform coincides with the end of the VCO clock cycle phase fraction PHASE F value as shown at the right hand one of each of the pair of vertical dimension lines in FIG. 1B. The VCO clock cycle phase fraction PHASE F value is also cyclical. In the example shown in FIG. 1B, the VCO clock cycle phase fraction PHASE F value is ⅛, then ⅖, then ⅜, then ⅘, then ⅝, then ⅚, then ⅞, then 0, before returning again to ⅛ in successive cycles of the synthesized target waveform.

A phase interpolator can be used to synthesize a waveform from a VCO clock output. As shown in FIG. 1C, and as is well known in the art, a digital portion of a phase interpolator is used to generate the cumulative phase integer PHASE I value and the VCO clock cycle phase fraction PHASE F value for synthesizing any output frequency from a given VCO clock output (e.g., by using the FCW accumulator technique described above). This information can then be used by an analog portion of the phase interpolator to generate the synthesized target waveform.

As noted above, when dividing a VCO clock signal by a number including a fractional component, the frequency synthesizer operation requires dynamic values for the integer and fraction inputs to a phase interpolator analog portion because the VCO clock output is not being divided by a constant integer for each cycle of the target output clock. For every frequency to be generated, a different pattern of dynamic values will be necessary.

Referring now to FIG. 2, a set of three tables showing the cumulative phase integer (PHASE I) value, the phase integer delta (PHASE IΔ) value and the VCO clock cycle phase fraction (PHASE F) value resulting from three illustrative VCO non-integer divisor values, 8+⅛, 8+⅜, and 9+⅞, respectively, used to generate output frequencies from a VCO oscillator. Each column of each table shows the cumulative phase integer PHASE I value, the phase integer delta PHASE IΔ value, and the VCO clock cycle phase fraction PHASE F value components of successive single cycles of the synthesized target waveform. The top line in each table is the cumulative phase integer (PHASE I) value which is the total number of accumulated quantized phase increments. This number resets every n cycles of the synthesized target waveform, where n is the denominator of the fractional portion of the divisor by which the VCO clock frequency is being divided to synthesize the synthesized target waveform. In each of the three illustrative examples shown in FIG. 2, n=8. The second line in each table is the phase integer delta (PHASE IΔ) value which is the integer number of VCO cycles that occur during a single cycle of the synthesized target waveform. For example, where the phase integer delta (PHASE IΔ) value is 8, the immediately prior cumulative phase integer PHASE I value for the previous single cycle of the synthesized target waveform will be 8 less than the current cumulative phase integer PHASE I value (e.g., if the immediately prior cumulative phase integer PHASE I value was 40, the cumulative phase integer PHASE I value for the current single cycle of the synthesized target waveform would then be 48). The third line in each table is the current VCO clock cycle phase fraction (PHASE F) value which is the fractional portion of a VCO cycle for the current single cycle of the synthesized target waveform. The fourth line in each table is the VCO clock cycle phase fraction PHASE F value expressed in terms of the VCO clock cycle phase in a system where, as an example, each VCO clock cycle is quantized into 1,024 phase increments. It is seen, for example, that in a system where each VCO clock cycle is quantized into 1,024 phase increments, a VCO clock cycle phase fraction of $3/8$ equates to a VCO clock cycle phase of 384 (=1,024*$3/8$).

From an examination of FIG. 2, persons of ordinary skill in the art will observe the cyclical behavior of the phase integer delta (PHASE I$\Delta$) value and the VCO clock cycle phase fraction (PHASE F) value, where the integer portion modulates between 8 and 9 and the where the fractional portion of divisor for the VCO=8, the values in the ninth column in each table are the same as the values in the first column of that table. The modulation of the phase integer delta (PHASE I$\Delta$) value may be referred to as a "seam".

Persons of ordinary skill in the art will appreciate that a different table will be generated for each individual value of the VCO fractional divisor. Such skilled persons will also appreciate that the number of columns in any table before the values of the phase integer delta (PHASE I$\Delta$) begin to repeat will be equal to the denominator of the value of the VCO cycle phase fraction PHASE F.

Because no phase interpolator will interpolate phase perfectly, it is expected that the phase interpolator will have integral non-linearity (INL) errors. This means that for a given fractional value, the phase interpolator will not perfectly interpolate that fractional value within the VCO clock cycle. Calibration RAM circuitry has been used in the prior art to correct the INL for a given fraction.

BRIEF DESCRIPTION

In accordance with an aspect of the invention, a circuit for correcting phase interpolator rollover integral non-linearity errors includes a rollover detector circuit for detecting when a rollover event of a phase interpolator (referred to hereinafter as an "interpolator rollover event") has occurred, and a correction circuit that adds a signed predistortion correction to a VCO clock cycle phase fraction value when the rollover detector circuit has detected the interpolator rollover event.

In accordance with an aspect of the invention, the circuit further includes an integral non-linearity distortion pre-correction circuit for pre-correcting the VCO clock cycle phase fraction value for integral non-linearity distortion.

In accordance with an aspect of the invention, the rollover detector circuit includes a forward rollover detector circuit that detects when a forward interpolator rollover event has occurred, and a reverse rollover detector circuit that detects when a reverse interpolator rollover event has occurred.

In accordance with an aspect of the invention, the forward rollover detector circuit includes a circuit that compares an actual phase integer delta with an expected value of phase integer delta and detects that the forward interpolator rollover event has occurred when the actual value of the phase integer delta is equal to the expected value of the phase integer delta incremented by 1, and the reverse rollover detector circuit comprises a circuit that compares the delta between the actual value of the phase integer delta with the expected value of the phase integer delta and detects that the reverse interpolator rollover event has occurred when the actual value of the phase integer delta is equal to the expected value of the phase integer delta decremented by 1.

In accordance with an aspect of the invention, the circuit that compares the actual phase integer delta and detects that the forward interpolator rollover event has occurred when the compared delta is equal to the expected delta incremented by 1 includes a flip-flop having an input at which a current cumulative phase integer value appears and a output at which an immediately prior cumulative phase integer value appears, a subtractor that subtracts the current cumulative phase integer value from the immediately prior cumulative phase integer value to generate the actual phase integer delta, and a magnitude comparator that compares the output of the subtractor with the expected phase integer delta value incremented by 1, and the circuit that compares the actual phase integer delta and detects that the reverse interpolator rollover event has occurred when the delta is equal to the expected delta decremented by 1 includes the flip-flop having an input at which the current cumulative phase integer value appears and a output at which the immediately prior cumulative phase integer value appears, the subtractor that subtracts the current cumulative phase integer value from the immediately prior cumulative phase integer value to generate the actual phase integer delta, and a magnitude comparator that compares the output of the subtractor with the expected phase integer delta value decremented by 1.

In accordance with an aspect of the invention, the circuit further includes a circuit for setting a forward interpolator rollover event flag on a CARRY signal when a forward interpolator rollover event has been detected, and a circuit for setting a reverse interpolator rollover event flag on a CARRY signal when a reverse interpolator rollover event has been detected.

In accordance with an aspect of the invention, the correction circuit that adds a signed predistortion correction to the VCO clock cycle phase fraction value when the interpolator rollover event has been detected includes a forward signed predistortion correction circuit that adds a first forward signed predistortion correction to the VCO clock cycle phase fraction value on a CARRY signal following when the forward interpolator rollover event has been detected, and a reverse signed predistortion correction circuit that adds a first reverse signed predistortion correction to the VCO clock cycle phase fraction value on a CARRY signal following when the reverse interpolator rollover event has been detected.

In accordance with an aspect of the invention, the circuit further includes a circuit for setting a second forward interpolator rollover event flag on a CARRY signal following setting the forward interpolator rollover event flag, and a circuit for setting a second reverse interpolator rollover event flag on a CARRY signal following setting the reverse interpolator rollover event flag.

In accordance with an aspect of the invention, the circuit further includes a forward signed predistortion correction circuit for adding a forward signed predistortion correction to the VCO clock cycle phase fraction value on the CARRY signal following setting the second interpolator rollover event flag, and a reverse signed predistortion correction circuit for adding a reverse signed predistortion correction to the VCO clock cycle phase fraction value on the CARRY signal following setting the second interpolator rollover event flag.

In accordance with an aspect of the invention, the circuit further includes a second forward signed predistortion correction circuit for adding a second forward signed predistortion correction to the VCO clock cycle phase fraction value on the CARRY signal following setting the second interpolator rollover event flag, and a second reverse signed predistortion correction circuit for adding a second reverse signed predistortion correction to the VCO clock cycle phase fraction value on the CARRY signal following setting the second interpolator rollover event flag.

In accordance with an aspect of the invention, a method for correcting phase interpolator rollover integral non-linearity errors includes detecting when a rollover event of a phase interpolator has occurred, and adding a signed predistortion correction to the VCO clock cycle phase fraction value when the interpolator rollover event has been detected.

In accordance with an aspect of the invention, detecting when the interpolator rollover event has occurred includes determining whether a forward interpolator rollover event has occurred, and determining whether a reverse interpolator rollover event has occurred.

In accordance with an aspect of the invention, determining whether the forward interpolator rollover event has occurred includes comparing an actual phase integer delta between a current cumulative phase integer value and an immediately prior cumulative phase integer value with an expected phase integer delta and indicating that a forward interpolator rollover event has occurred when the actual phase integer delta is equal to the expected phase integer delta incremented by 1, and determining whether the reverse interpolator rollover event has occurred includes comparing the actual phase integer delta between the current cumulative phase integer value and the immediately prior cumulative phase integer value with the expected phase integer delta and indicating that a reverse interpolator rollover event has occurred when the actual phase integer delta is equal to the expected phase integer delta decremented by 1.

In accordance with an aspect of the invention, comparing the actual phase integer delta between the current cumulative phase integer value and the immediately prior cumulative phase integer value with the expected delta and indicating that the forward interpolator rollover event has occurred when the actual phase integer delta is equal to the expected delta incremented by 1 includes subtracting the current cumulative phase integer value from the immediately prior cumulative phase integer value, and comparing the difference with the expected phase integer delta value incremented by 1, and comparing the actual phase integer delta between the current cumulative phase integer value and the immediately prior cumulative phase integer value with the expected delta and indicating that the reverse interpolator rollover event has occurred when the actual phase integer delta is equal to the expected phase integer delta decremented by 1 includes subtracting the current cumulative phase integer value from the immediately prior cumulative phase integer value, and comparing the difference with the expected delta value decremented by 1.

In accordance with an aspect of the invention, indicating that the forward interpolator rollover event has occurred when the actual phase integer delta is equal to the expected phase integer delta incremented by 1 includes setting a forward interpolator rollover event flag, and indicating that the reverse interpolator rollover event has occurred when the actual phase integer delta is equal to the expected phase integer delta decremented by 1 includes setting a reverse interpolator rollover event flag.

In accordance with an aspect of the invention, adding the signed predistortion correction to the VCO clock cycle phase fraction value when the interpolator rollover event has been detected includes adding a first forward signed predistortion correction to the VCO clock cycle phase fraction value when the forward interpolator rollover event has been detected, and adding a first reverse signed predistortion correction to the VCO clock cycle phase fraction value when the reverse interpolator rollover event has been detected.

In accordance with an aspect of the invention, the method further includes adding a second forward signed predistortion correction to the VCO clock cycle phase fraction value after the first forward signed predistortion correction has been added to the VCO clock cycle phase fraction value, and adding a second reverse signed predistortion correction to the VCO clock cycle phase fraction value after the first forward signed predistortion correction has been added to the VCO clock cycle phase fraction value.

BRIEF DESCRIPTION OF THE DRAWING FIGURES

The invention will be explained in more detail in the following with reference to embodiments and to the drawing in which are shown:

FIG. 1A and FIG. 1B are waveform diagrams that illustrate the concept of phase integer delta, VCO clock cycle phase fraction, and rollover in a frequency synthesizer environment;

FIG. 1C is a block diagram of an illustrative phase interpolator that may be used in a frequency synthesizer;

FIG. 2 is set of tables showing cumulative phase integer (PHASE I), phase integer delta (PHASE IΔ), and VCO clock cycle phase fraction (PHASE F) values resulting from three illustrative VCO divisor values;

DETAILED DESCRIPTION

Figure 3:
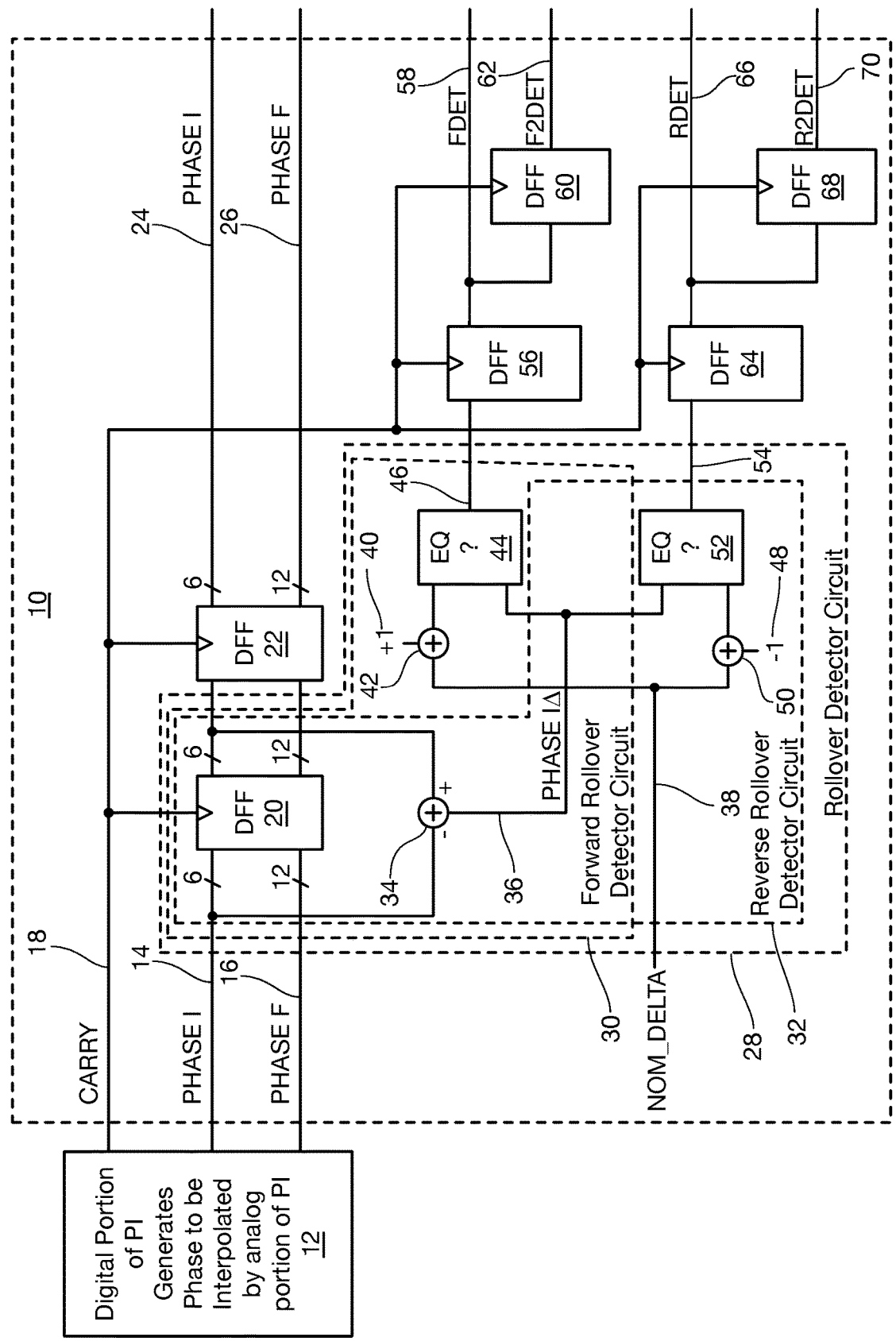
FIG. 3 is a block diagram of a circuit for detecting both forward rollovers and backward rollovers in accordance with an aspect of the invention.

Persons of ordinary skill in the art will realize that the following description is illustrative only and not in any way limiting. Other embodiments will readily suggest themselves to such skilled persons.

Large changes in INL error have been observed in circuit simulations as the phase to be interpolated experiences a rollover event. A rollover event occurs at the seam and is defined as the points at which the value of the phase integer delta (PHASE IΔ) transitions between minimum and maximum values (i.e., from 8 to 9, and from 9 to 8, in each of the tables of FIG. 2). The rollover event is a forward rollover event when the value of the phase integer delta PHASE IΔ transitions low-to-high (i.e., 8 to 9 in FIG. 2) and is a reverse rollover event when the value of the phase integer delta PHASE IΔ transitions high-to-low (i.e., 9 to 8 in FIG. 2). This is attributed to an internal power rail voltage being disturbed when the value of the phase integer delta PHASE IΔ changes (increase to decrease or decrease to increase) as the synthesized target waveform passes through the rollover. After the fractional phase value presented at the second VCO clock cycle following the rollover the internal power rail voltage stabilizes and the INL error caused by the disturbance is not of significance.

The rollover type of INL error described above cannot be calibrated very well using a calibration RAM without significant system level complexity and hardware cost. This is because every frequency to be generated requires a different pattern of vales for the phase integer delta (PHASE IΔ) and VCO clock cycle phase fractions (PHASE F), and the seam error manifests differently for every frequency. The distortion caused by the rollover or seam error can overwhelm the natural INL of the phase interpolator causing significant additional deterministic jitter. Compensating for this would require an unreasonably large calibration RAM and continuous calibration each time the generated frequency changes. Even with the added hardware and complexity the results are generally insufficient.

In accordance with the present invention, the VCO clock cycle phase fraction (Phase F) values being sent to the phase interpolator are modified at the two consecutive VCO clock cycle fraction PHASE F values following the rollover event. This can be viewed as pre-distorting the phase values to be interpolated. The pre-distorted phase values can be used to calibrate the INL associated with the seam INL error to reduce the interpolation error.

Error correction hardware according to the present embodiments generates a phase pre-distortion at the two consecutive VCO clock cycle fraction PHASE F value following the rollover event in both the forward (PHASE IΔ transitions low-to-high) and reverse (PHASE IΔ transitions high-to-low) direction. The error correction hardware generates a PHASE F pre-distortion that is coincident with the integer value modulation in both the forward and reverse rollover events. The error correction hardware also generates a PHASE F pre-distortion to correct an error at a second PHASE F value at the phase immediately following the modulation of the phase integer delta (PHASE IΔ) value.

In accordance with an aspect of the present invention, the pre-distortion is automatically adjusted as the frequency is changed.

A detection hardware according to the present embodiments monitors the state of the phase interpolator digital portion to detect forward rollover events and reverse rollover events. The detection hardware then triggers the error correction hardware to pre-distort the VCO clock cycle phase fraction PHASE F value to be interpolated to account for the expected distortion in the synthesized target waveform.

Referring now to FIG. 3, a block diagram depicts detection hardware in the form of a circuit 10 for detecting both forward rollovers and backward rollovers in accordance with an aspect of the present invention.

The circuit 10 is driven by a digital portion 12 of a phase interpolator which generates the phase to be interpolated. The digital portion 12 of the phase interpolator generates a cumulative phase integer PHASE I value output on line 14, a VCO clock cycle phase fraction PHASE F value output on line 16 and asserts the CARRY signal output on line 18. In accordance with one embodiment of the invention depicted in FIG. 3, the cumulative phase integer PHASE I value output 14 is a 6-bit value and the VCO clock cycle phase fraction PHASE F value output 16 is a 12-bit value, but persons of ordinary skill in the art will appreciate that different resolutions of the cumulative phase integer PHASE I value and the VCO clock cycle phase fraction PHASE F value are within the scope of the present invention. As is known in the art, the CARRY signal can be provided to circuitry not utilized in the present invention that will delay it by a time period that is equivalent to the cumulative phase integer PHASE F value output on line 16 to define an edge of each new cycle of the synthesized target clock waveform.

The CARRY signal, when asserted, triggers both data flip-flops 20 and data flip-flops 22, where data flip-flops 22 are cascaded with the data flip-flops 20, to capture successive cumulative phase integer PHASE I values and VCO clock cycle phase fraction PHASE F values outputs 14 and 16. The cumulative phase integer PHASE I value and the VCO clock cycle phase fraction PHASE F value on lines 14 and 16 are latched into data flip-flops 20 on the CARRY signal assertion on line 18. On the next CARRY signal assertion on line 18, the cumulative phase integer PHASE I value and the VCO clock cycle phase fraction PHASE F value at the output of the data flip-flops 20 are latched into the data flip-flops 22 and appear at its outputs 24 and 26 while the successive cumulative phase integer PHASE I value and the VCO clock cycle phase fraction PHASE F value on lines 14 and 16 are latched into data flip-flops 20. The cumulative phase integer PHASE I value and the VCO clock cycle phase fraction PHASE F value outputs, delayed by two successive CARRY signal assertions on line 18 are provided at the output of data flip-flops 22 on lines 24 and 26.

The circuit 10 includes a rollover detector circuit shown within dashed lines 28 that includes both a forward rollover detector circuit shown within dashed lines 30 and a reverse rollover detector circuit shown within dashed lines 32. Data flip-flops 20 are common to both the forward rollover detector circuit 30 and the reverse rollover detector circuit 32.

A subtractor 34 common to both the forward rollover detector circuit 30 and the reverse rollover detector circuit 32 subtracts the current cumulative phase integer PHASE I value output 14 from the most recent value, i.e. the previous cumulative phase integer PHASE I value appearing at the output of the data flip-flops 20. Its output on lines 36 represents the actual phase integer delta PHASE IΔ value of the current cumulative phase integer PHASE I value (i.e. the difference between the current cumulative phase integer PHASE I value output 14 and the previous cumulative phase integer PHASE I value, i.e. the cumulative phase integer PHASE I value output 14 before the most recent CARRY signal assertion).

An expected phase integer delta NOM_DELTA value at lines 38 is the nominal integer value of the phase integer delta during non-rollover cycles (e.g., "8" in the top and center tables of FIG. 2 and "9" in the bottom table of FIG. 2) and is provided to both the forward rollover detector circuit 30 and the reverse rollover detector circuit 32. In the forward rollover detector circuit 30, the expected phase integer delta NOM_DELTA value is incremented by 1 as shown at reference numeral 40 in an adder 42. The output of the adder 42 is compared with the actual phase integer delta PHASE IΔ value calculated by the subtractor 34 at line 36 by a magnitude comparator 44. If the output of the magnitude comparator 44 at line 46 is false (i.e., the actual phase integer delta PHASE IΔ value at line 36 does not equal the incremented expected phase integer delta NOM_DELTA value at the output of the adder 42), a forward rollover event has not occurred. If the output of the magnitude comparator 44 at line 46 is true (i.e., the actual phase integer delta PHASE IΔ value at line 36 equals the incremented expected phase integer delta NOM_DELTA value at the output of the adder 42) a forward rollover event has occurred.

In the reverse rollover detector circuit 32, the expected phase integer delta NOM_DELTA value is decremented by 1 as shown at reference numeral 48 in an adder 50. The output of the adder 50 is compared with the actual phase integer delta PHASE IΔ value calculated by the subtractor 34 at line 36 by a magnitude comparator 52. If the output of the magnitude comparator 52 at line 54 is false (i.e., the actual phase integer delta PHASE IΔ value at line 36 does not equal the decremented expected phase integer delta NOM_DELTA value at the output of the adder 50), a reverse rollover event has not occurred. If the output of the magnitude comparator 52 at line 54 is true (i.e., the actual phase integer delta PHASE IΔ value at line 36 equals the decremented expected phase integer delta NOM_DELTA value at the output of the adder 50) a reverse rollover event has occurred.

The true or false output of the magnitude comparator 44 appearing on line 46 is latched into data flip-flop 56 on the next CARRY signal assertion to generate a FDET output on line 58 that is true only if a forward rollover event has occurred prior to the most recent CARRY signal assertion. The data flip-flop 56 is a circuit for setting a forward interpolator rollover event flag FDET on a CARRY signal assertion when a forward interpolator rollover event has been detected. The output of the data flip-flop 56 is the forward interpolator rollover event flag FDET. The forward interpolator rollover event flag FDET output of the data flip-flop 56 is latched into data flip-flop 60 on the following CARRY signal assertion to generate a F2DET output on line 62 that is true only if a forward rollover event has been latched into data flip-flop 56 on the immediately prior CARRY signal assertion. The data flip-flop 60 is a circuit for setting a second forward interpolator rollover event flag on a CARRY signal following setting the forward interpolator rollover event flag. The output of the data flip-flop 60 is a second forward interpolator rollover event flag F2DET.

Similarly, the true or false output of the magnitude comparator 52 is latched into data flip-flop 64 on the next CARRY signal assertion to generate a RDET output on line 66 that is true only if a reverse rollover event has occurred prior to the most recent CARRY signal assertion. The data flip-flop 64 is a circuit for setting a reverse interpolator rollover event flag RDET on a CARRY signal assertion when a reverse interpolator rollover event has been detected. The output of the data flip-flop 64 is the reverse interpolator rollover event flag RDET. The reverse interpolator rollover event flag RDET output of the data flip-flop 64 is latched into data flip-flop 68 on the following CARRY signal assertion to generate a R2DET output on line 70 that is true only if a reverse rollover event has been latched in data flip-flop 64 on the immediately prior CARRY signal assertion. Data flip-flop 68 is thus a circuit for setting a second reverse interpolator rollover event flag R2DET on a CARRY signal following setting the reverse interpolator rollover event flag, RDET. The output of the data flip-flop 68 is the second reverse interpolator rollover event flag R2DET.

Once a forward or reverse rollover event is detected, the correction is performed by providing a signed rollover predistortion correction value to the output of a calibration RAM that provides correction for the expected INL errors from the phase interpolator, as will be explained further below.

Each new cycle of the synthesized target waveform will include an integer number of VCO cycles (cumulative phase integer PHASE I value) and a VCO cycle fraction (PHASE F) value. The difference in the integer number of VCO cycles in 2 successive synthesized target waveform cycles to be interpolated by the phase interpolator will be the phase integer delta PHASE IΔ, referred to in the tables of FIG. 2. For the case where the VCO frequency is divided by 8+⅛, the phase integer delta PHASE IΔ value will be 8 until the forward rollover condition, where it will be 9 for 1 synthesized target waveform cycle. The expected phase integer delta NOM_DELTA value control input is programmed to be 8 in this example where the nominal integer value of the phase integer delta during non-roll over events is "8". The expected phase integer delta NOM_DELTA value +1 will be equal to the "rollover" 9 to assert the forward interpolator rollover event flag FDET output at the rollover event. This detects the cycle of the synthesized target waveform in which the forward rollover occurred. The detection hardware 10 of FIG. 3 identifies the synthesized target waveform cycles for which correction will be applied. For the case of 9+⅞, the expected phase integer delta NOM_DELTA value will be 9 until the rollover condition, where it will be 8 for 1 synthesized target waveform cycle. The expected phase integer delta NOM_DELTA value control input will be programmed to be 9 in this example where the nominal integer value of the phase integer delta during non-roll over synthesized target waveform cycles is "9". The expected phase integer NOM_DELTA value −1 will be equal to the "rollover" 8 to assert the reverse interpolator rollover event flag RDET output. This is detecting the cycle of the synthesized target waveform in which the reverse rollover occurred. These rollover cycles are identified and used to provide the predistortion correction for calibration as will be seen in FIG. 4.

Figure 4:
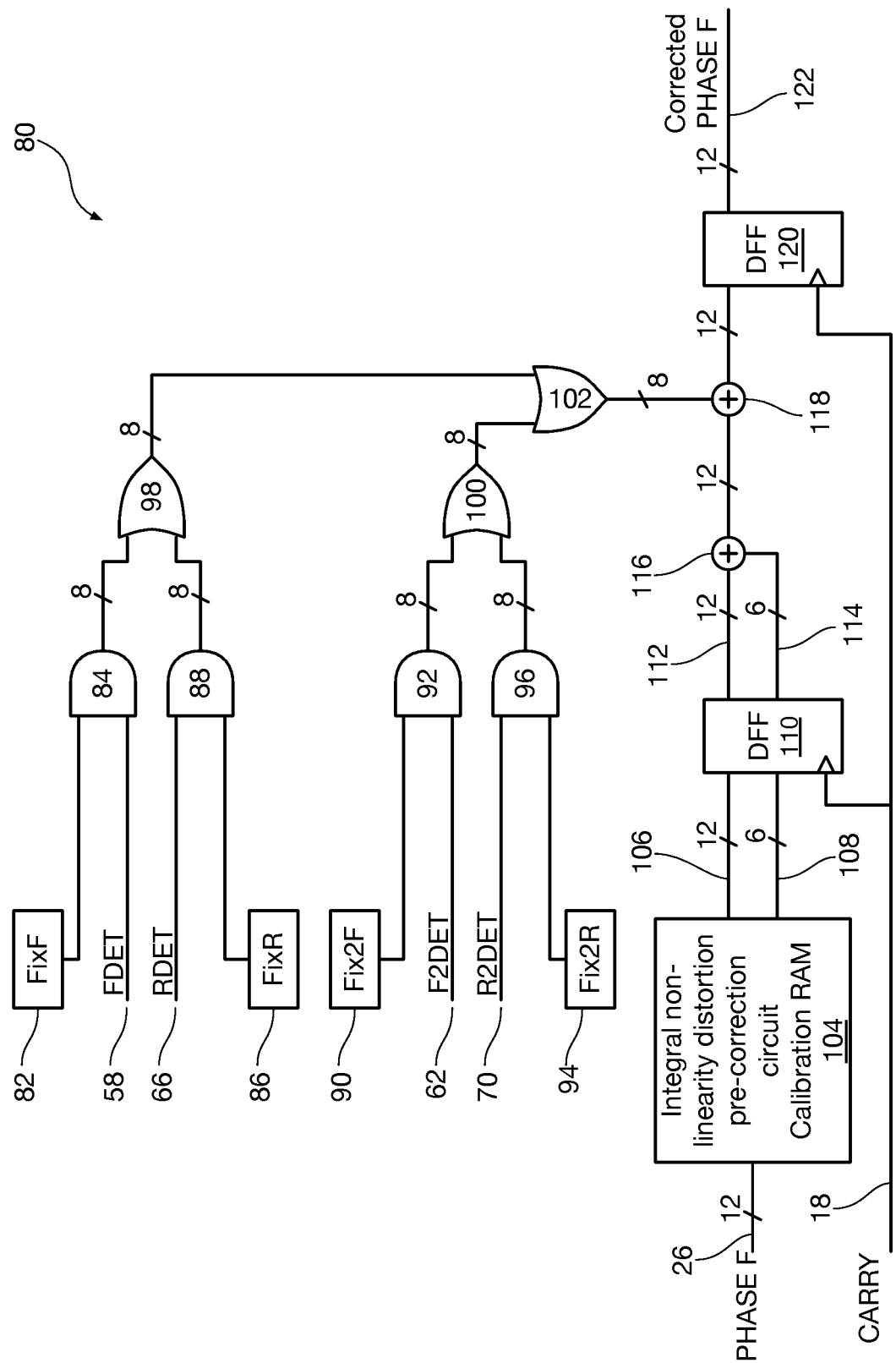
FIG. 4 is a block diagram of a circuit that provides a signed addition correction value to provide pre-distortion to a VCO cycle phase fraction value (PHASE F) provided to a phase interpolator at both forward rollover and backward rollover events in accordance with an aspect of the present invention.

Referring now to FIG. 4, a correction circuit 80 uses as inputs the FDET, F2DET, RDET, R2DET outputs 58, 62, 66, and 70, respectively to pass predistortion correction values. The forward interpolator rollover event flag FDET on line 58 is used to gate the signed correction value FixF stored at reference numeral 82 as a first signed forward correction value through AND gate 84, which may be an 8 bit value. The reverse interpolator rollover event flag RDET on line 66 is used to gate the signed correction value FixR stored at reference numeral 86 as a first signed reverse correction value through AND gate 88, which may be an 8 bit value. The second forward interpolator rollover event flag F2DET on line 62 is used to gate the signed correction value Fix2F stored at reference numeral 90 as a second forward correction value through AND gate 92, which may be an 8 bit value. The second reverse interpolator rollover event flag R2DET on line 70 is used to gate the signed correction value Fix2R stored at reference numeral 94 as a second signed reverse correction value through AND gate 96, which may be an 8 bit value. The flags on the FDET, F2DET, RDET, R2DET inputs 58, 62, 66, and 70, respectively, are thus each used to gate a single one of the signed correction values FixF, FixR, Fix2F, and Fix2R stored at reference numerals 82, 86, 90, and 94, respectively.

The outputs of AND gates 84 and 88 are combined in OR gate 98, which may be an 8 bit value, and the outputs of AND gates 92 and 96 are combined in OR gate 100, which may be an 8 bit value. The outputs of OR gates 98 and 100 are combined in OR gate 102, which passes the selected one of the signed correction values FixF, FixR, Fix2F, and Fix2R stored at reference numerals 82, 86, 90, and 94, respectively, and which may be an 8 bit value.

The VCO cycle fraction PHASE F value from line 26 of the circuit of FIG. 3 is used as an address to calibration RAM 104 (used to pre-correct for integral non-linearity distortion)

as is known in the art. The calibration RAM 104 is an integral non-linearity distortion pre-correction circuit in the form of a lookup table that provides the VCO cycle fraction PHASE F value on line 106, which may be a 12 bit value, plus a signed correction value associated with the VCO cycle fraction PHASE F value on line 108, which signed correction value may be a 6 bit value. These values are latched into data flip-flops 110 by the CARRY signal assertion on CARRY output 18 of the digital portion of the PI 12 of FIG. 3. The latched outputs appear on lines 112 and 114 respectively, which value on line 112 may be a 12 bit value and which value on line 114 may be a 6 bit value.

The signed latched correction value on line 114 is added to the VCO cycle fraction PHASE F value on line 112 in adder 116. The output of adder 116 is the INL corrected value, which may be a 12 bit value. The INL corrected value is added in signed adder 118 to the selected one of the signed correction values FixF, FixR, Fix2F, and Fix2R that appears at the output of OR gate 102. The output of OR gate 102 will be zero unless one of the FDET, F2DET, RDET, R2DET flags 58, 62, 66, and 70 has passed one of the predistortion correction values FixF, FixR, Fix2F, or Fix2R on lines 82, 86, 90, and 94, respectively through to the output of OR gate 102.

The FDET, F2DET, RDET, R2DET inputs 58, 62, 66, and 70 are thus one-hot flags (meaning only one of these can be asserted during each cycle). In one exemplary embodiment of the present invention, the FixF, FixR, Fix2F, Fix2R inputs on lines 82, 86, 90, and 94, respectively are 8-bit signed values which will add/subtract to the value of the VCO cycle fraction PHASE F output which is to be interpolated by the analog portion of the PI.

When the forward interpolator rollover event flag FDET is asserted, the FixF value will propagate to the signed adder 118. When the second forward interpolator rollover event flag F2DET is asserted, the Fix2F value will propagate to the signed adder 118. When the reverse interpolator rollover event flag RDET is asserted, the FixR value will propagate to the signed adder 118. When the second forward interpolator rollover event flag R2DET is asserted, the Fix2R value will propagate to the signed adder 118.

FixF 82, AND gate 84, OR gate 98, OR gate 102 and signed adder 118 together form a forward signed predistortion correction circuit for adding a forward signed predistortion correction to the phase fraction portion of the phase interpolator on the CARRY signal following setting the forward interpolator rollover event flag FDET. FixR 86, AND gate 88, OR gate 98, OR gate 102 and signed adder 118 together form a reverse signed predistortion correction circuit for adding a reverse signed predistortion correction to the phase fraction portion of the phase interpolator on the CARRY signal following setting the reverse interpolator rollover event flag RDET. Fix2F 90, AND gate 92, OR gate 100, OR gate 102, and signed adder 118 together form a second forward signed predistortion correction circuit for adding a second forward signed predistortion correction to the phase fraction portion of the phase interpolator on the CARRY signal following setting the second forward interpolator rollover event flag F2DET. Fix2R 94, AND gate 96, OR gate 100, OR gate 102, and signed adder 118 together form a second reverse signed predistortion correction circuit for adding a second reverse signed predistortion correction to the phase fraction portion of the phase interpolator on the CARRY signal following setting the second reverse interpolator rollover event flag R2DET.

The FixF, FixR, Fix2F, Fix2R signed values at reference numerals 82, 86, 90, and 94, respectively can be determined by initial system calibration or can also be determined by simulation and may be stored in nonvolatile memory or loaded into registers from nonvolatile memory during system startup.

The output of the signed adder 118, which may be a 12 bit value, is latched by data flip-flop 120, clocked by the CARRY signal on CARRY output 18 of the digital portion of the PI 12 of FIG. 3 and the corrected VCO cycle fraction PHASE F value is available on line 122, which may be a 12 bit value.

The corrected VCO cycle fraction PHASE F value on line 122 allows correction of the dynamic INL by pre-distorting the VCO cycle fraction PHASE F value to be interpolated to account for the dynamic INL which will occur during the rollover cycle and the subsequent cycle.

Figure 5:
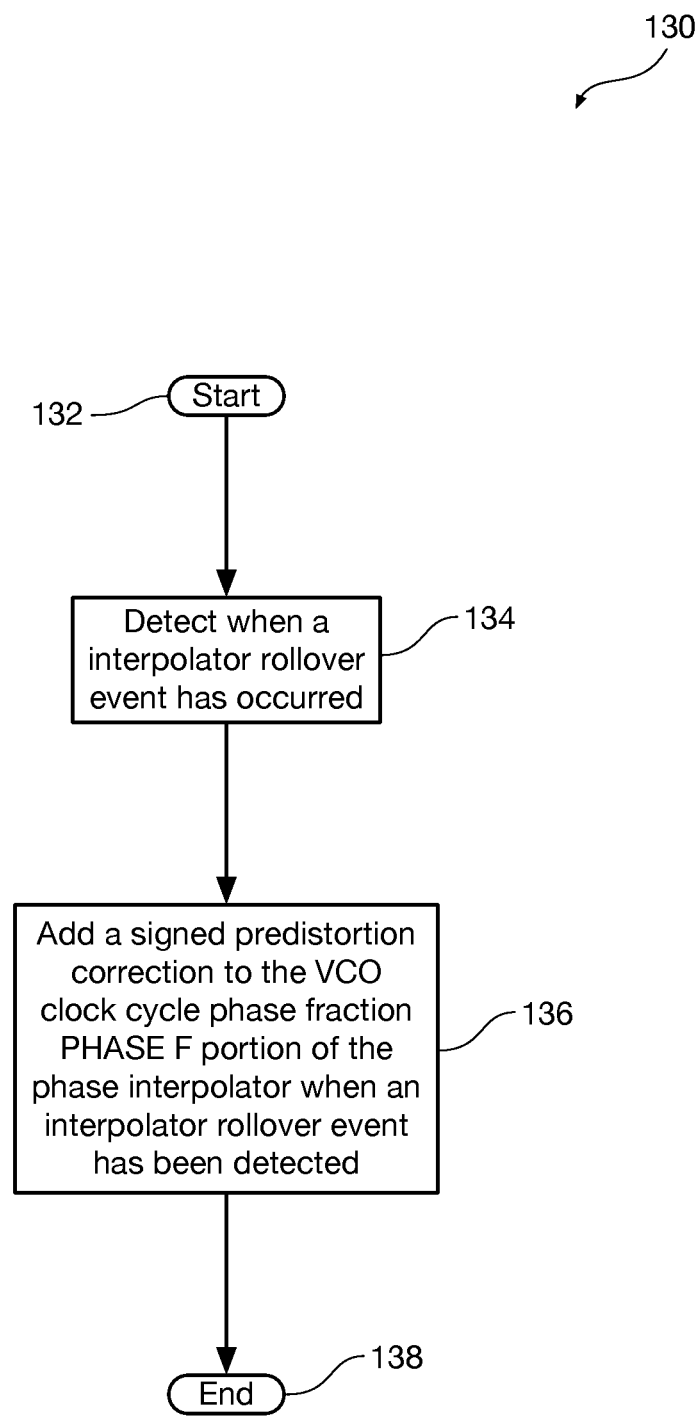
FIG. 5 is a flow diagram showing an illustrative method for correcting phase interpolator rollover integral non-linearity errors in accordance with an aspect of the invention.

Referring now to FIG. 5, a flow diagram illustrates a method 130 for correcting phase interpolator rollover integral non-linearity errors in accordance with an aspect of the invention. The method begins at reference numeral 132.

At reference numeral 134, a detection is made when an interpolator rollover event of a phase integer portion of a phase interpolator has occurred. At reference numeral 136, a signed predistortion correction is added to the VCO cycle fraction Phase F value of the phase interpolator when an interpolator rollover event has been detected. The method ends at reference numeral 138.

Figure 6:
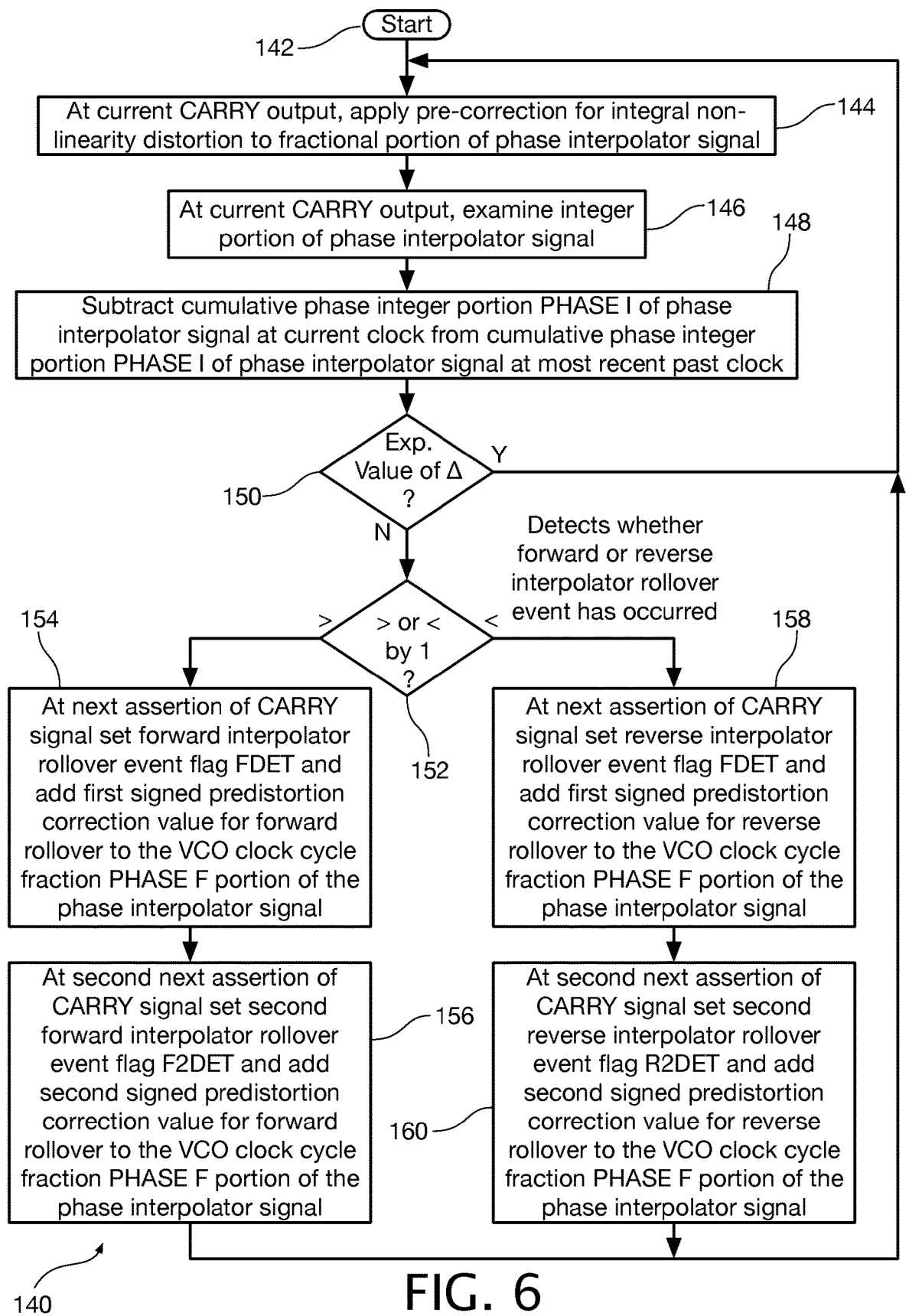
FIG. 6 is a flow diagram showing another illustrative method for correcting phase interpolator rollover integral non-linearity errors in accordance with an aspect of the invention.

Referring now to FIG. 6, a flow diagram illustrates a method 140 for correcting phase interpolator rollover integral non-linearity errors in accordance with an aspect of the invention. The method begins at reference numeral 142. In certain embodiments the method 140 implements further optional detail of method 130.

At reference numeral 144, at the current CARRY output, i.e. at the assertion of the CARRY signal, pre-correction is applied for integral non-linearity distortion to fractional portion of phase interpolator signal. At reference numeral 146, at the current CARRY output the cumulative phase integer PHASE I value, of the digital portion 12 of the phase interpolator is examined. At reference numeral 148, the cumulative phase integer PHASE I value of the phase interpolator at the current assertion of the CARRY signal is subtracted from the cumulative phase integer PHASE I value of the phase interpolator signal at the most recent past assertion of the CARRY signal.

At reference numeral 150, it is determined whether the subtraction resulted in an expected delta value (the NOM_DELTA value 38 of FIG. 3). If the subtraction resulted in the expected delta value, the method returns to reference numeral 144. If the subtraction did not result in the expected delta value, the method proceeds to reference numeral 152, where it is determined if the result of the subtraction was one more or one less than the expected delta value. If the result of the subtraction was one more or one less than the expected delta value a rollover event has occurred.

If the result of the subtraction was one more than the expected delta value, the rollover event is a forward rollover event and the method proceeds to reference numeral 154, where a forward interpolator rollover event flag FDET is set and a first signed predistortion correction value for forward rollover is added to the VCO cycle fraction PHASE F value of the phase interpolator signal at the next assertion of the CARRY signal. The method then proceeds to reference numeral 156, where at a second next assertion of the CARRY signal a second forward interpolator rollover event flag F2DET is set and second signed predistortion correction value for forward rollover is added to the VCO cycle fraction PHASE F value of the phase interpolator signal. The method then returns to reference numeral 144.

If the result of the subtraction was one less than the expected delta value, the rollover is a reverse rollover and the method proceeds to reference numeral 158, where a reverse interpolator rollover event flag RDET is set and a first signed predistortion correction value for reverse rollover is added to the VCO cycle fraction PHASE F value of the phase interpolator signal after the next assertion of the CARRY signal. The method then proceeds to reference numeral 160, where after a second next assertion of the CARRY signal a second reverse interpolator rollover event flag R2DET is set and a second signed predistortion correction value for reverse rollover is added to the VCO cycle fraction PHASE F value of the phase interpolator signal. The method then returns to reference numeral 144.

The solution of the present invention results in improved deterministic jitter generated by the phase interpolating hardware.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims

What is claimed is:

1. A circuit for correcting phase interpolator rollover integral non-linearity errors comprising:
    a rollover detector circuit for detecting when a rollover event of a phase interpolator has occurred; and
    a correction circuit that adds a signed predistortion correction to a voltage controlled oscillator (VCO) clock cycle phase fraction value when the rollover detector circuit has detected the rollover event of the phase interpolator.

2. The circuit of claim 1 further comprising an integral non-linearity distortion pre-correction circuit for pre-correcting the VCO clock cycle phase fraction value for integral non-linearity distortion.

3. The circuit of claim 1 wherein the rollover detector circuit comprises:
    a forward rollover detector circuit that detects when a forward rollover event of the phase interpolator has occurred; and
    a reverse rollover detector circuit that detects when a reverse rollover event of the phase interpolator has occurred.

4. The circuit of claim 3 wherein:
    the forward rollover detector circuit comprises a circuit that compares an actual phase integer delta value with an expected phase integer delta value and detects that the forward rollover event of the phase interpolator has occurred when the actual phase integer delta value is equal to the expected phase integer delta value incremented by 1; and
    the reverse rollover detector circuit comprises a circuit that compares the actual phase integer delta value with the expected phase integer delta value and detects that the reverse rollover event of the phase interpolator has occurred when the actual phase integer delta value is equal to the expected phase integer delta value decremented by 1.

5. The circuit of claim 4 wherein:
    the circuit that compares the actual phase integer delta value with the expected phase integer delta value and detects that the forward rollover event of the phase interpolator has occurred when the actual phase integer delta value is equal to the expected phase integer delta value incremented by 1 comprises a data flip-flop having an input at which a current cumulative phase integer value appears and an output at which an immediately prior cumulative phase integer value appears, a subtractor that subtracts the current cumulative phase integer value from the immediately prior cumulative phase integer value to generate the actual phase integer delta value, and a first magnitude comparator that compares the output of the subtractor with the expected phase integer delta value incremented by 1; and
    the circuit that compares the actual phase integer delta with the expected phase integer delta value and detects that the reverse rollover event of the phase interpolator has occurred when the actual phase integer delta value is equal to the expected phase integer delta value decremented by 1 comprises the data flip-flop having the input at which the current cumulative phase integer value appears and the output at which the immediately prior cumulative phase integer value appears, the subtractor that subtracts the current cumulative phase integer value from the immediately prior cumulative phase integer value to generate the actual phase integer delta value, and a second magnitude comparator that compares the output of the subtractor with the expected phase integer delta value decremented by 1.

6. The circuit of claim 3 wherein the correction circuit that adds the signed predistortion correction to the VCO clock cycle phase fraction value when the rollover event of the phase interpolator has been detected comprises:
    a forward signed predistortion correction circuit that adds a first forward signed predistortion correction to the VCO clock cycle phase fraction value on a CARRY signal assertion following when the forward rollover event of the phase interpolator has been detected, and a reverse signed predistortion correction circuit that adds a first reverse signed predistortion correction to the VCO clock cycle phase fraction value on a CARRY signal assertion following when the reverse rollover event of the phase interpolator has been detected.

7. The circuit of claim 3 further comprising:
    a circuit for setting a forward interpolator rollover event flag on a CARRY signal when a forward rollover event of the phase interpolator has been detected; and
    a circuit for setting a reverse interpolator rollover event flag on a CARRY signal when a reverse rollover event of the phase interpolator has been detected.

8. The circuit of claim 7 further comprising:
    a circuit for setting a second forward interpolator rollover event flag on a CARRY signal assertion following setting the forward interpolator rollover event flag; and
    a circuit for setting a second reverse interpolator rollover event flag on a CARRY signal following setting the reverse interpolator rollover event flag.

9. The circuit of claim 8 further comprising:
    a forward signed predistortion correction circuit for adding a forward signed predistortion correction to the VCO clock cycle phase fraction value on the CARRY signal following setting the forward interpolator rollover event flag; and
    a reverse signed predistortion correction circuit for adding a reverse signed predistortion correction to the VCO clock cycle phase fraction value on the CARRY signal following setting the reverse interpolator rollover event flag.

10. The circuit of claim 8 further comprising:
a second forward signed predistortion correction circuit for adding a second forward signed predistortion correction to the VCO clock cycle phase fraction value on the CARRY signal assertion following setting the second forward interpolator rollover event flag; and
a second reverse signed predistortion correction circuit for adding a second reverse signed predistortion correction to the VCO clock cycle phase fraction value on the CARRY signal assertion following setting the second reverse interpolator rollover event flag.

11. A method for correcting phase interpolator rollover integral non-linearity errors comprising:
detecting when a rollover event of a phase interpolator has occurred; and
adding a signed predistortion correction to a voltage controlled oscillator (VCO) clock cycle phase fraction value of the phase interpolator when the rollover event of the phase interpolator has been detected.

12. The method of claim 11 wherein detecting when the rollover event of the phase interpolator has occurred comprises:
determining whether a forward rollover event of the phase interpolator has occurred; and
determining whether a reverse rollover event of the phase interpolator has occurred.

13. The method of claim 12 wherein:
determining whether the forward rollover event of the phase interpolator has occurred comprises comparing an actual phase integer delta value between a current cumulative phase integer value and an immediately prior cumulative phase integer value with an expected phase integer delta value and indicating that a forward rollover event of the phase interpolator has occurred when the actual phase integer delta value is equal to the expected phase integer delta value incremented by 1; and
determining whether the reverse rollover event of the phase interpolator has occurred comprises comparing the actual phase integer delta value between the current cumulative phase integer value and the immediately prior cumulative phase integer value with the expected phase integer delta value and indicating that a reverse rollover event of the phase interpolator has occurred when the actual phase integer delta value is equal to the expected phase integer delta value decremented by 1.

14. The method of claim 13 wherein:
comparing the actual phase integer delta value between the current cumulative phase integer value and the immediately prior cumulative phase integer value with the expected phase integer delta value and indicating that the forward rollover event of the phase interpolator has occurred when the actual phase integer delta value is equal to the expected phase integer delta value incremented by 1 comprises subtracting the current cumulative phase integer value from the immediately prior cumulative phase integer value, and comparing the difference with the expected phase integer delta value incremented by 1; and
comparing the actual phase integer delta value between the current cumulative phase integer value and the immediately prior cumulative phase integer value with the expected phase integer delta value and indicating that the reverse rollover event of the phase interpolator has occurred when the actual phase integer delta value is equal to the expected phase integer delta value decremented by 1 comprises subtracting the current cumulative phase integer value from the immediately prior cumulative phase integer value, and comparing the difference with the expected phase integer delta value decremented by 1.

15. The method of claim 13 wherein:
indicating that the forward rollover event of the phase interpolator has occurred when the actual phase integer delta value is equal to the expected phase integer delta value incremented by 1 comprises setting a forward interpolator rollover event flag; and
indicating that the reverse rollover event of the phase interpolator has occurred when the actual phase integer delta value is equal to the expected phase integer delta value decremented by 1 comprises setting a reverse interpolator rollover event flag.

16. The method of claim 11 wherein adding the signed predistortion correction to the VCO clock cycle phase fraction value when the rollover event of the phase interpolator has been detected comprises:
adding a first forward signed predistortion correction to the VCO clock cycle phase fraction value when a forward rollover event of the phase interpolator has been detected; and
adding a first reverse signed predistortion correction to the VCO clock cycle phase fraction value when a reverse rollover event of the phase interpolator has been detected.

17. The method of claim 16 further comprising:
adding a second forward signed predistortion correction to the VCO clock cycle phase fraction value after the first forward signed predistortion correction has been added to the VCO clock cycle phase fraction value; and
adding a second reverse signed predistortion correction to the VCO clock cycle phase fraction value after the first forward signed predistortion correction has been added to the VCO clock cycle phase fraction value.

* * * * *

UNITED STATES PATENT AND TRADEMARK OFFICE
CERTIFICATE OF CORRECTION

PATENT NO. : 11,323,123 B2
APPLICATION NO. : 16/827691
DATED : May 3, 2022
INVENTOR(S) : Mike Willingham It is certified that error appears in the above-identified patent and that said Letters Patent is hereby corrected as shown below:

On the Title Page

Item (56) References Cited: please add:

| | | | |
|---|---|---|---|
| --8,243,759 | B2 | 8/2012 | Rahbar |
| 8,010,355 | B2 | 8/2011 | Rahbar |
| 8,023,641 | B2 | 9/2020 | Rahbar |
| 8,335,319 | B2 | 12/2012 | Rahbar |
| 8,483,244 | B2 | 7/2013 | Rahbar |
| 8,599,986 | B2 | 12/2013 | Rahbar |
| 8,774,227 | B2 | 7/2014 | Rahbar |
| 8,957,711 | B2 | 2/2015 | Jin et al. |
| 8,971,548 | B2 | 5/2015 | Rahbar et al. |
| 9,209,965 | B2 | 12/2015 | Rahbar et al. |
| 9,444,474 | B2 | 9/2016 | Rahbar et al.-- |

Signed and Sealed this
Ninth Day of August, 2022

Katherine Kelly Vidal
*Director of the United States Patent and Trademark Office*